(12) United States Patent
Ichihara et al.

(10) Patent No.: US 8,878,224 B2
(45) Date of Patent: Nov. 4, 2014

(54) SEMICONDUCTOR ELEMENT

(71) Applicant: Nichia Corporation, Anan (JP)

(72) Inventors: Takashi Ichihara, Selangor Darul Ehsan (MY); Yasuhiro Miki, Tokushima (JP)

(73) Assignee: Nichia Corporation, Anan-Shi, Tokushima (JP)

( * ) Notice: Subject to any disclaimer, the term of this patent is extended or adjusted under 35 U.S.C. 154(b) by 27 days.

(21) Appl. No.: 13/627,310

(22) Filed: Sep. 26, 2012

(65) Prior Publication Data
US 2013/0075914 A1    Mar. 28, 2013

(30) Foreign Application Priority Data

Sep. 27, 2011  (JP) .................................. 2011-211345
Jul. 26, 2012   (JP) .................................. 2012-165537

(51) Int. Cl.
| | |
|---|---|
| *H01L 29/22* | (2006.01) |
| *H01L 29/43* | (2006.01) |
| *H01L 33/42* | (2010.01) |
| *H01L 33/38* | (2010.01) |

(52) U.S. Cl.
CPC ................ *H01L 29/43* (2013.01); *H01L 33/42* (2013.01); *H01L 33/38* (2013.01)
USPC ............................... 257/99; 257/98; 257/100

(58) Field of Classification Search
CPC ........................................... H01L 33/38–33/387
USPC ..................................................... 257/98–100
See application file for complete search history.

(56) References Cited

U.S. PATENT DOCUMENTS

| | | | |
|---|---|---|---|
| 8,026,118 B2 * | 9/2011 | Shinohara et al. | 438/46 |
| 8,227,283 B2 * | 7/2012 | Seong et al. | 438/47 |
| 8,580,668 B2 * | 11/2013 | Cho et al. | 438/597 |
| 2010/0230714 A1 * | 9/2010 | Shinohara et al. | 257/103 |
| 2011/0089401 A1 * | 4/2011 | Hiraiwa et al. | 257/13 |
| 2012/0049223 A1 * | 3/2012 | Yang et al. | 257/98 |

FOREIGN PATENT DOCUMENTS

| | | |
|---|---|---|
| JP | 2009-094108 A | 4/2009 |
| JP | 2010-40654 A | 2/2010 |

* cited by examiner

*Primary Examiner* — Matthew W Such
*Assistant Examiner* — Ali Naraghi
(74) *Attorney, Agent, or Firm* — Squire Patton Boggs (US) LLP

(57) ABSTRACT

There is provided a semiconductor element including a semiconductor layer, a translucent electrode which is formed on the semiconductor layer, and a pad electrode which is formed on the translucent electrode, wherein the translucent electrode includes a recessed part on which the pad electrode is mounted, and wherein a thickness of a bottom surface of the recessed part of the translucent electrode is more than 0% of and equal to or less than 70% of a thickness of a part of the translucent electrode other than the recessed part.

11 Claims, 9 Drawing Sheets

US 8,878,224 B2

SEMICONDUCTOR ELEMENT

CROSS REFERENCE TO RELATED APPLICATIONS

This application claims the priorities of Japanese Application No. 2011-211345, filed on Sep. 27, 2011 and Japanese Application No. 2012-165537, filed on Jul. 26, 2012, the entire specification, claims and drawings of which are incorporated herewith by reference.

BACKGROUND OF THE INVENTION

1. Field of the Invention

The present invention relates to a semiconductor element which is used for a light emitting diode or the like which is suitable for a light source of a display, illumination, an optical communication or an office automation equipment or the like and more particularly to a semiconductor element which is excellent in brightness and mass productivity.

2. Description of the Related Art

In an electrode (a p-side electrode) of a conventional semiconductor element (a nitride semiconductor element 100), a translucent electrode layer (a translucent electrode 60) is provided on a p-type nitride semiconductor layer 40 for evenly diffusing current and improving the output of the semiconductor element 100 as shown in FIG. 12. Further, a pad electrode (a p-side pad electrode 70p) formed of metallic materials by sputtering, vapor deposition or plating is provided on the translucent electrode 60 for wire bonding. A semiconductor element has been also disclosed in which a structure of an electrode is changed from a conventional structure (see Unexamined Japanese Patent Application Publication No. 2009-94108, for example). With such an electrode, a structure has been tried to be developed which prevents the electrode from being peeled off when a wire is bonded and a structure has also been tried to be developed which prevents the electrode from being peeled off during the operation of the semiconductor element (see Unexamined Japanese Patent Application Publication No. 2010-40654, for example).

However, there has been the following problem in the conventional technique. Namely, there is still a need to improve the effect of preventing the peeling of the electrode although the structure which prevents the peeling of the electrode when a wire is bonded and the structure which prevents the peeling of the electrode during the operation of the semiconductor element have been tried to be developed as described above.

As for the peeling of the translucent electrode, it has been known that if the film thickness of the translucent electrode is made thinner in the semiconductor element, the translucent electrode is difficult to be peeled off from the interface between the semiconductor layer and the translucent electrode. However, if the translucent electrode is simply made thinner, the sheet resistance of the translucent electrode becomes higher, and thus current cannot be diffused evenly in the semiconductor element 100. In other words, as the diffusion of current becomes inadequate, it causes problems that light from the semiconductor element (a light emitting element) becomes spotted, the output of the semiconductor element is decreased and the driving voltage thereof needs to be higher.

SUMMARY OF THE INVENTION

The present invention has been made in view of the above described problem and an object of the present invention is to provide a semiconductor element which realizes even luminance intensity and a low driving voltage while keeping high adhesiveness between a semiconductor layer and a translucent electrode.

A first aspect of the present invention is to provide a semiconductor element including a semiconductor layer, a translucent electrode which is formed on the semiconductor layer, and a pad electrode which is formed on the translucent electrode, wherein the translucent electrode includes a recessed part on which the pad electrode is mounted, and wherein a thickness of a bottom surface of the recessed part of the translucent electrode is more than 0% of and equal to or less than 70% of a thickness of a part of the translucent electrode other than the recessed part.

With this structure in which the thickness of the bottom surface of the recessed part of the translucent electrode is more than 0% of and equal to or less than 70% of the thickness of the part of the translucent electrode other than the recessed part, the bottom surface of the recessed part of the translucent electrode is made thinner, whereby the peeling of the translucent electrode is prevented. Further, it is also possible to make the sheet resistance be low, whereby current can be evenly diffused in the semiconductor layer since the part of the translucent electrode other than the recessed part is not too thin.

In the aforementioned semiconductor element, it is preferable that a gap is formed between a side surface of the pad electrode and a side surface of the recessed part of the translucent electrode. With this structure, it is possible to suppress light from being absorbed by the side surface of the pad electrode.

In the aforementioned semiconductor element, it is preferable that the gap is filled with a translucency film which has a refractive index smaller than a refractive index of the translucent electrode. With this structure, it is easy for light to be transmitted outside, whereby the light output of the semiconductor element is enhanced.

In the aforementioned semiconductor element, it is preferable that the side surface of the pad electrode is inclined inside toward an upper side of the pad electrode from a peripheral edge of a base end of the pad electrode. Further, in the aforementioned semiconductor element, a part of the side surface of the recessed part may be covered by the pad electrode.

With this structure in which the side surface of the pad electrode is inclined, light from a light emitting element is difficult to hit the pad electrode, whereby the light absorption by the pad electrode can be suppressed. Further, even if a part of light from the light emitting element hits the side surface of the pad electrode, the light is reflected upward. Thus, the light which has been hit on the side surface of the pad electrode can be used efficiently. Further, as the side surface of the pad electrode is inclined, the coating characteristic of the translucency film is improved and it becomes easy to make the protection layer to cover and be adhered to the side surface of the pad electrode.

In the aforementioned semiconductor element, it is preferable that the thickness of the part of the translucent electrode other than the recessed part is equal to or more than 80 nm and equal to or less than 300 nm. Further, in the aforementioned semiconductor element, it is preferable that the sheet resistance of the translucent electrode is equal to or less than 40Ω/□. The sheet resistance is one of the ways for representing a resistance of a thin film which has a uniform thickness. For a unit of the sheet resistance, an area resistance rate Ω/□ (ohm/square) is used which represents a resistance per a unit area (a square having the same longitudinal and transversal length).

With this structure in which the thickness of the part of the translucent electrode other than the recessed part is equal to or more than 80 nm, the sheet resistance becomes lower. On the other hand, the thickness of the part of the translucent electrode other than the recessed part does not become too thick by making the thickness of the part of the translucent electrode other than the recessed part be equal to or less than 300 nm. Thus, it is possible to prevent the peeling of the translucent electrode. Further, with the structure in which the sheet resistance is less than or equal to 40Ω/□, the sheet resistance does not become too high, whereby current is easy to be diffused in the semiconductor layer.

In the aforementioned semiconductor element, it is preferable that an area of the bottom surface of the recessed part is equal to or more than 2700 μm². With this structure, it is possible to easily mount the pad electrode. Further, it is also possible to secure the upper surface area of the pad electrode on which a wire is bonded at the time of wire bonding in the case where the area of the pad electrode is equal to or more than 2700 μm².

Further, in the aforementioned semiconductor element, the pad electrode may be a multiple-layer having, as a bottom layer, a layer comprised of Cr or an alloy including Cr. With this structure, it is possible to prevent the peeling of the translucent electrode from the semiconductor layer and also to strengthen the adhesiveness between the translucent electrode and the pad electrode.

In accordance with the semiconductor element of the present invention, it is possible to prevent the peeling of the translucent electrode at the time of wire bonding and also to prevent the peeling of the translucent electrode during the operation of the semiconductor element. Further, it is also possible to make the luminance intensity of the semiconductor element even and to make its driving voltage lower. Thus, a reliable light emitting element can be provided in which the possibility of the peeling of the electrode is decreased and the output is made high with even luminance intensity.

DESCRIPTION OF THE PREFERRED EMBODIMENTS

Figure 1A:
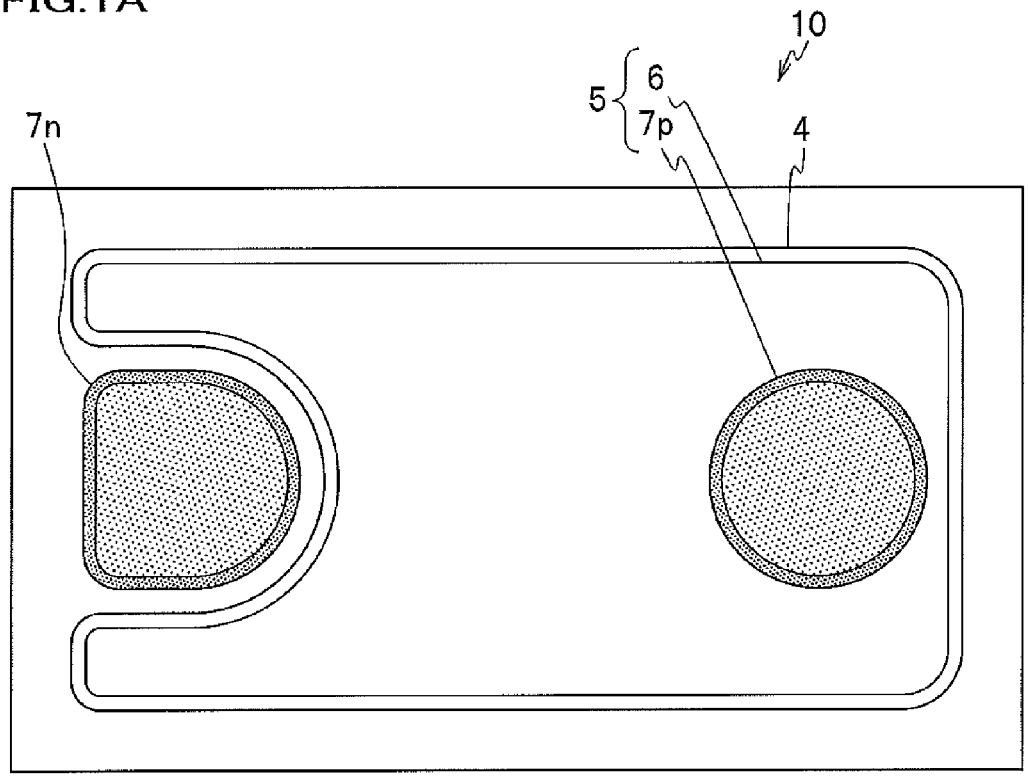
FIG. 1A is a schematic plain view of a structure of a semiconductor element (a nitride semiconductor element) according to a first embodiment of the present invention

An embodiment of the semiconductor element according to the present invention is described below with reference to the accompanying drawings. It is to be noted that the size of members or the positional relationship of members shown in each figure may be exaggerated for clarifying the description. In the following description, the same names or reference numerals represent the same members or members formed of a similar material, and the repeated explanation thereof will be omitted as appropriate.

First Embodiment

Semiconductor Element

A semiconductor element of the present invention includes at least a semiconductor layer, a translucent electrode provided on the semiconductor layer, and a pad electrode provided on the translucent electrode. More specifically, the semiconductor element of the present invention is, for example, a nitride semiconductor element which includes a n-type nitride semiconductor layer, a p-type nitride semiconductor layer which is stacked on the n-type nitride semiconductor layer, a translucent electrode which is formed on the p-type nitride semiconductor layer, a p-side pad electrode which is formed on a part of the translucent electrode and a n-side pad electrode which is formed on the n-type nitride semiconductor layer. The translucent electrode includes a recessed part in which the pad electrode is mounted. The thickness of the translucent electrode on the lower side of the recessed part is larger than 0% of and is equal to or less than 70% of the thickness of a part of the translucent electrode other than the recessed part.

Figure 1B:
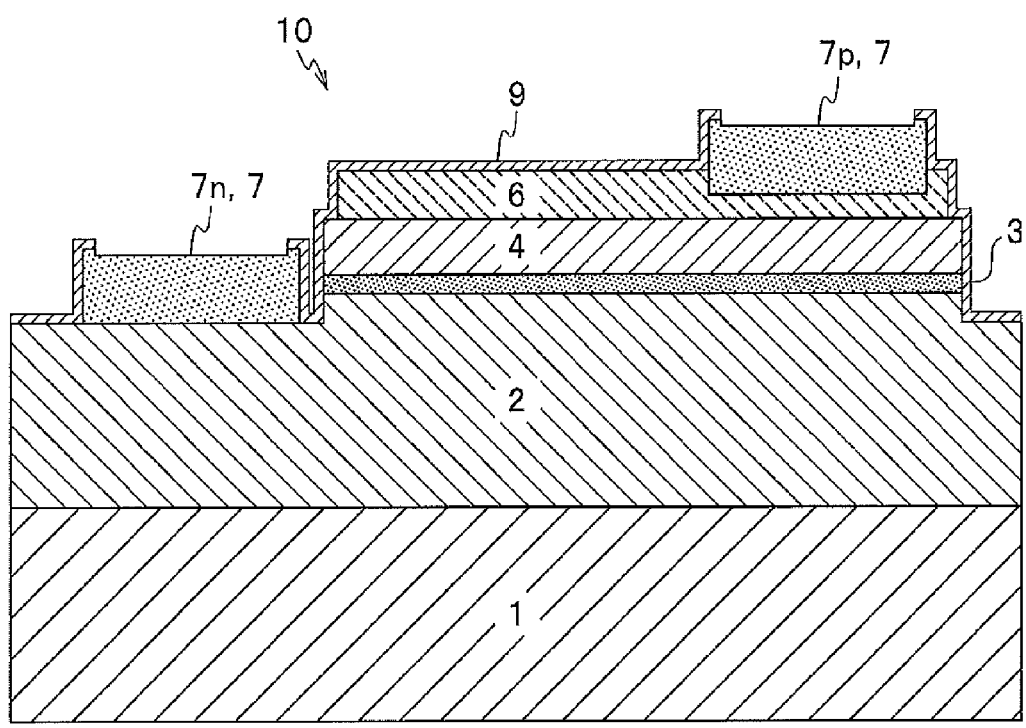
FIG. 1B is a schematic cross sectional view of a structure of a semiconductor element (a nitride semiconductor element) according to a first embodiment of the present invention.
Figure 2:
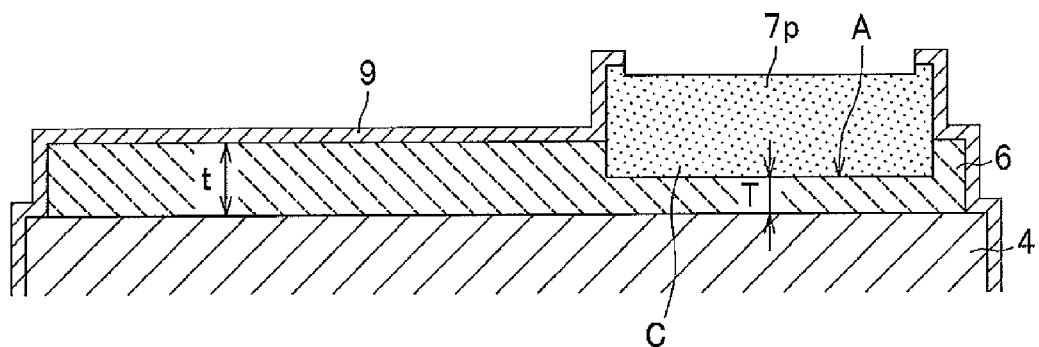
FIG. 2 is an enlarged cross sectional view schematically showing the structure of the translucent electrode in the nitride semiconductor element shown in FIGS. 1A and 1B.

A nitride semiconductor element 10 is shown in FIGS. 1 and 2 as an example structure of the semiconductor element of the present invention. A structure of the semiconductor element of the present invention is described below by using the nitride semiconductor element 10 as an example.

A nitride semiconductor element 10 according to a first embodiment of the present invention is a light emitting element. The nitride semiconductor element 10 includes an n-type nitride semiconductor layer 2, an active layer 3 and a p-type nitride semiconductor layer 4 which are stacked on a substrate 1 as shown in FIG. 1B. Further, the nitride semiconductor element 10 includes on its upper side a n-side electrode (a n-side pad electrode) 7n which is electrically connected to the n-type nitride semiconductor layer 2 and a p-side electrode 5 which is electrically connected to the p-type nitride semiconductor layer 4. The nitride semiconductor element 10 also includes an insulating protection layer (a protection membrane) 9 on the upper surface of the nitride semiconductor element 10. The n-side electrode 7n is a pad electrode and is formed on the surface of the n-type nitride semiconductor layer 2 exposed by removing a part of the p-type nitride semiconductor layer 4 and the active layer 3. On the other hand, the p-side electrode 5 is comprised of a translucent electrode 6 which is formed over substantially entire part of the upper surface of the p-type nitride semiconductor layer 4 and a pad electrode (a p-side pad electrode) 7p which is formed on a part of the protection layer 9 covers entire surface of the nitride semiconductor element 10 except for the upper surfaces of the n-side electrode 7n and the p-side pad electrode 7p. It is to be noted that "up" in this specification indicates the side where the nitride semiconductor layer is provided with respect to the substrate and means the upper side in FIG. 1B.

Substrate

The substrate 1 may be formed of any material as long as the nitride semiconductor can be epitaxially grown on the substrate, and its size and thickness are not limited. Materials of such a substrate may be an insulating substrate, such as sapphire or spinel ($MgA_{12}O_4$) of which major surface is either one of C-face, R-face or A-face, silicon carbide (SiC), ZnS, ZnO, Si, GaAs, diamond or an oxide substrate such as lithium niobate or neodymium gallate which is lattice-connected with a nitride semiconductor.

N-Type Nitride Semiconductor Layer, Active Layer, P-Type Nitride Semiconductor Layer Gallium nitride compound semiconductor such as, for example, $In_xAl_yGa_{1-X-Y}N$ ($0 \leq X$, $0 \leq Y$, $X+Y<1$) is preferably used for the n-type nitride semiconductor layer 2, the active layer 3 and the p-type nitride semiconductor layer 4 (collectively referred to as "nitride semiconductor layer 2, 3, 4") although the n-type nitride semiconductor layer 2, the active layer 3 and the p-type nitride semiconductor layer 4 are not limited to the gallium nitride compound semiconductor.

N Side Electrode, P Side Electrode

The n-side electrode 7n is electrically connected to the n-type nitride semiconductor layer 2 and the p-side electrode 5 is electrically connected to the p-type nitride semiconductor layer 4, respectively to supply electricity from outside. A gallium nitride compound semiconductor, which is preferable among nitride semiconductors, is difficult to become p-type. In short, the p-type nitride semiconductor layer 4 is tended to have comparatively high resistance. Thus, if an electrode is connected to only a part of the p-type nitride semiconductor layer 4, the electricity supplied to the nitride semiconductor element 10 is difficult to be diffused in the p-type nitride semiconductor layer 4, and the light becomes uneven throughout the surface of the p-type nitride semiconductor layer 4. Therefore, the p-side electrode 5 needs to be connected to a larger area of the p-type nitride semiconductor layer 4 so that the current flows evenly throughout the surface of the p-type nitride semiconductor layer 4. The p-side electrode 5 includes a translucent electrode 6 which is directly formed on the entire part or the substantially entire part of the upper surface of the p-type nitride semiconductor layer 4 in order not to decrease the light extraction efficiency by the p-side electrode 5 since the upper surface of the nitride semiconductor element 10 is designed to be a light extracting surface of the nitride semiconductor element 10. The p-side electrode 5 further includes on the translucent electrode 6 the pad electrode (a p-side pad electrode) 7p having on its surface Au that has excellent bonding property so that the p-side electrode 5 is connected to an external circuit by a wire bonding or the like. The p-side pad electrode 7p has a plain view shape and an area which are necessary for bonding and do not shade large amount of light. The p-side pad electrode 7p is formed to be smaller than the plain view shape of the translucent electrode 6 and is incorporated in the translucent electrode 6. More specifically, the p-side pad electrode 7p is formed in a part of the translucent electrode 6.

On the other hand, the connection area of the n-side electrode 7n may be small since the n-type nitride semiconductor layer 2 has a low-resistance. Therefore, the n-side electrode 7n may be comprised only of a pad electrode (a n-side pad electrode) which does not transmit light and may be directly formed on the n-type nitride semiconductor layer 2. Since the nitride semiconductor element 10 according to the present embodiment includes the n-side pad electrode 7n on its upper surface, the active layer 3 and the p-type nitride semiconductor layer 4 are removed (see FIG. 1B) in an area where the n-side pad electrode 7n is connected on the n-type nitride semiconductor layer 2. The area where the active layer 3 and the p-type nitride semiconductor layer 4 are removed does not emit light. Therefore, similarly to the p-side pad electrode 7p, the n-side electrode (a n-side pad electrode) 7n is formed to have the plain view shape and the area which is required for bonding and being electrically connected to the n-type nitride semiconductor layer 2 such that the n-side electrode (a n-side pad electrode) 7n does not largely reduce the light emitting amount. Respective positions of the n-side pad electrode 7n and the p-side pad electrode 7p in a plain view of the nitride semiconductor element 10 are not limited and may be determined based on the workability of bonding and may also be determined so that the amount of light which is shaded by the pad electrodes 7n, 7p and a wire connected to an external circuit becomes small.

Translucent Electrode

The translucent electrode 6 in the p-side electrode 5 is formed of a conductive oxide. Although metallic thin film may be used for the translucent electrode, the conductive oxide is more superior in translucency than the metallic thin film; the nitride semiconductor element 10 can be made to be a light emitting element having higher luminance efficiency. As the conductive oxide, an oxide including at least one substance which is selected from a group of Zn, In, Sn and Mg is considered. More specifically, the oxide may be ZnO, $In_2O_3$, $SnO_2$ and ITO. More specifically, ITO has a high light permeability in visible light (visible area) and has a comparatively high electric conductivity, which makes it preferable to use ITO. The shape of the translucent electrode 6 may be, for example, one piece rectangular shape which is matched to the plain view shape of the p-type nitride semiconductor layer 4. The translucent electrode 6 may also be formed in a pattern, such as a lattice-shape, a meshed shape, a dotted shape, a stripe shape and a net-like shape. Further, the translucent electrode 6 may include concave portions and convex portions on its surface except for the area where the p-side pad electrode 7p is provided. As described above, it is possible to improve light extraction efficiency by defining the shape or the surface state of the translucent electrode 6.

In the translucent electrode 6, the thickness T of the translucent electrode 6 on the bottom surface A of the recessed part C is formed to be thinner than the thickness t of a part of the translucent electrode 6 other than the recessed part C, as shown in FIG. 2. Here, the thickness t represents a thickness from the bottom surface of the translucent electrode 6 to the highest position of the translucent electrode 6 with which the surface of the p-side pad electrode 7$p$ is in contact. A part of the translucent electrode 6 where the p-side pad electrode 7$p$ is provided is recessed as shown in FIG. 2. The p-side pad electrode 7$p$ is mounted on the bottom surface A of the recessed part C which is recessetly formed. In other words, the bottom surface A of the recessed part C is a pad mounting part with which the bottom surface of the lowest part of the p-side pad electrode 7$p$ comes in contact. The thickness T of the bottom surface A of the recessed part C of the translucent electrode 6 is a thickness of the translucent electrode 6 at the lower part of the recessed part C and is the thickness of the translucent electrode 6 right below the bottom surface A of the recessed part C (the pad mounting part). In the translucent electrode 6, the bottom surface A of the recessed part C may have a rough surface or concave and convex portions. In this case, a part of the bottom surface A of the recessed part C that is the thickest is referred to as the thickness T of the translucent electrode 6.

Figure 3:
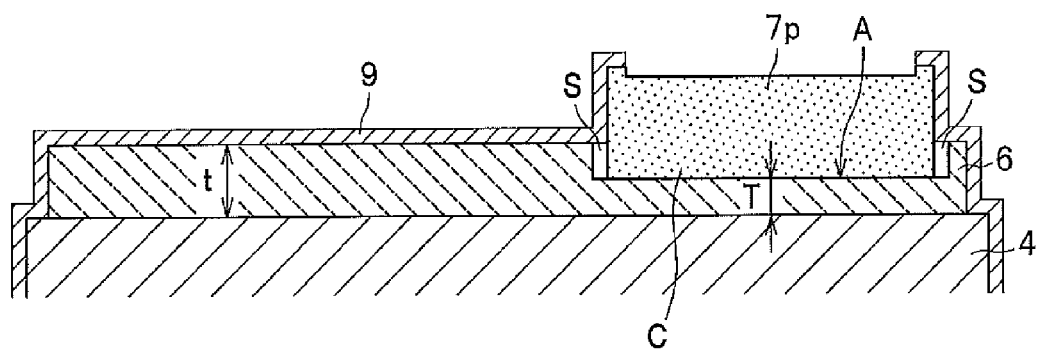
FIG. 3 is an enlarged cross sectional view schematically showing the structure of the translucent electrode in the nitride semiconductor element according to a second embodiment of the present invention.

The lower surface of the p-side pad electrode 7$p$ is buried in the translucent electrode 6 and comes in close contact with the translucent electrode 6 in FIG. 2, however, the recessed part C may be formed to have larger diameter than that of the p-side pad electrode 7$p$ (see FIG. 3). Further, the bottom surface A of the recessed part C may have a circle shape when the p-side pad electrode 7$p$ has a circle shape in a top view, and the bottom surface A of the recessed part C may be a rectangular shape when the p-side pad electrode 7$p$ has a rectangular shape. In the case where the recessed part C is formed to have a diameter larger than that of the p-side pad electrode 7$p$ as described above, the recessed part C is not limited to this shape. The recessed part C may be any shape as long as the p-side pad electrode 7$p$ can be mounted on the recessed part C. Furthermore, it is preferable that the size difference between the p-side pad electrode 7$p$ and the recessed part C (i.e. the difference between an end of the p-side pad electrode 7$p$ and an end of the recessed part C in a plain view) is equal to or less than approximately 1 μm. This is because as the distance between the end of the pad electrode 7$p$ and the end of the recessed part C becomes shorter, the effect of the current diffusion becomes larger, whereby a forward voltage (Vf) is decreased.

Further, it is preferable that the area of the bottom surface of the recessed part C is equal to or more than 2700 μm². Usually, the diameter of the area which is exposed from the protection layer 9 on the upper surface of the pad electrode needs to be 60 μm or more preferably 70 μm when bonding a wire on the pad electrode for connecting to an external power source. If the diameter becomes smaller than 60 μm, the measurement of the optical and electrical property (characteristic) of the semiconductor element by probing may be difficult. Therefore, if the area of the bottom surface of the recessed part C is equal to or more than 2700 μm², it is easy to mount the p-side pad electrode 7$p$. More preferably, the area is equal to or more than 3675 μm². Further, the area is preferably equal to or less than 6075 μm² in consideration of the sheet resistance (current diffusion). It is to be noted that the area does not have to be designed as described above if the pad electrode is provided with a supplemental electrode. A supplemental electrode may be provided for diffusing current from the pad electrode. A recessed part may also be provided on the lower part of the part where the supplemental electrode is mounted. In this case, the adhesiveness between the supplemental electrode and the translucent electrode 6 is preferably enhanced.

In the translucent electrode 6, the thickness of the bottom surface A of the recessed part C of the translucent electrode 6 is more than 0% of and equal to or less than the thickness of the area of the translucent electrode 6 other than the recessed part C. If the thickness of the bottom surface A of the recessed part C of the translucent electrode 6 becomes more than 70%, there is a possibility of peeling of the translucent electrode 6 during a process of wire bonding or the operation of the nitride semiconductor element 10. Therefore, the thickness of the bottom surface A of the recessed part C should be equal to or less than 70% of that of the translucent electrode 6. Preferably, the thickness the bottom surface A is equal to or less than 60%. When the translucent electrode 6 is provided on the p-type nitride semiconductor layer 4, the thickness of the translucent electrode 6 right below the p-side pad electrode 7$p$ needs to exceed 0 nm (i.e. the thickness of the bottom surface A of the recessed part C of the translucent electrode 6 exceeds 0% of the thickness of the area of the translucent electrode 6 other than the recessed part C) to make the translucent electrode 6 right below the p-side pad electrode 7$p$ to exert current diffusion effect. More preferably, the thickness of the bottom surface A of the recessed part C is equal to or more than 10 nm. As described above, the thickness of the bottom surface A of the recessed part C of the translucent electrode 6 is designed to be more than 0% of and equal to or less than 70% of the thickness of the area of the translucent electrode 6 other than the recessed part C.

The area of the translucent electrode 6 other than the recessed part C refers to an area of the translucent electrode 6 where the p-side pad electrode 7$p$ is not provided, and the protection layer 9 is formed on the surface of the area. With the area of the translucent electrode 6 other than the recessed part C, current is evenly diffused in the p-type nitride semiconductor layer 4, improving the output of the nitride semiconductor element 10. The thickness t of the area of the translucent electrode 6 other than the recessed part C is preferably in a range of 80 nm to 300 nm. If the thickness t of the translucent electrode 6 other than the recessed part C is equal to or more than 80 nm, it is possible to reduce the sheet resistance, whereby current is easy to be diffused in the p-type nitride semiconductor layer 4. More preferably, the thickness t of the translucent electrode 6 other than the recessed part C is equal to or more than 100 nm. Further, the lower part of the pad electrode 7$p$ is buried into the translucent electrode 6 and the thickness T does not become too large by making the thickness t of the translucent electrode 6 other than the recessed part C be equal to or less than 300 nm, whereby the translucent electrode 6 becomes more difficult to be peeled off. More preferably, the thickness t of the translucent electrode 6 other than the recessed part C is equal to or less than 200 nm.

Further, it is preferable that the sheet resistance of the translucent electrode 6 is equal to or less than 40Ω/□. If the sheet resistance is equal to or less than 40Ω/□, it is easy for the current to be diffused in the p-type nitride semiconductor layer 4. More preferably, the sheet resistance of the translucent electrode 6 is equal to or less than 30Ω/□. The lower sheet resistance is preferable, and the lowest limit thereof is not defined. The sheet resistance can be controlled to be equal to or less than 40Ω/□ by making the thickness t of the part of the translucent electrode 6 other than the recessed part C be equal to or more than the predetermined value. The measurement of the sheet resistance can be performed, for example, by a four-terminal four-probe method by using a resistivity meter MCP-T600 manufactured by Mitsubishi chemical corporation.

Pad Electrode

In the nitride semiconductor element 10 according to the embodiment, the n-side pad electrode 7n and the p-side pad electrode 7p have the same laminate structure and are collectively referred to as a pad electrode 7 as appropriate. The structure of the pad electrode 7 is not limited and may be any structure as long as the structure is generally used. For example, the structure may be a structure in which a Ti layer, a Rh layer, a W layer and an Au layer are laminated on the translucent electrode 6 in this order (referred to as "Ti/Rh/W/Au", hereinafter), a structure of "Cr/Rh/W/Au", "Rh/W/Au" "Cr/Pt/Ru/Au" or a structure of "CrRh/Pt/Au". In this specification, CrRh represents an alloy of Cr and Rh.

The Ti layer is a layer for improving adhesiveness between the n-side pad electrode 7n and the n-type nitride semiconductor layer 2 and adhesiveness between the p-side pad electrode 7p and the translucent electrode 6. The Rh layer is a layer for improving light extraction efficiency of the light from the nitride semiconductor element 10 by reflecting light incident on the pad electrode 7 (especially, the light which has been transmitted through the bottom layer). Further, in the Rh layer the minute amount of Rh is dispersed to the lowest layer by annealing treatment, which makes it possible to easily make an ohmic contact between the pad electrode 7 and the translucent electrode 6.

The W layer is a layer for improving the strength against the peeling of the pad electrode 7. The W layer having larger thickness is better; however, if it is too thick, the manufacturing time and the manufacturing cost are increased. On the other hand, if the W layer is too thin, the W layer is warped by a stress. Therefore, the thickness of the W layer is preferably in a range of 30 to 100 nm. More preferably, the thickness of the W layer is 50 nm.

The Au layer (a bonding layer) is provided for connecting a wire or a bump from outside of the nitride semiconductor element 10 and constitutes a surface (the top surface) of the pad electrode 7. Au having an excellent adhesiveness with wire (wire bondability) and an excellent corrosion resistance is used in the Au layer. In order to keep its bondability, it is preferable that the thickness of the Au layer is equal to or more than 100 nm. More preferably, the thickness of the Au layer is equal to or more than 200 nm. Forward voltage is also decreased if the Au layer is thick. In view of productivity, it is preferable that the thickness of the Au layer is equal to or less than 1500 nm. More preferably, it is equal to or less than 1000 nm.

The Cr layer is a layer for improving adhesiveness between the n-side pad electrode 7n and the n-type nitride semiconductor layer 2 and adhesiveness between the p-side pad electrode 7p and the translucent electrode 6. Cr forms a film which has an excellent adhesiveness with the n-type nitride semiconductor layer 2 and with the translucent electrode 6 which is a conductive oxide, respectively. The film can also make the ohmic contact with the n-type nitride semiconductor layer 2. It is preferable that the thickness of the Cr layer is equal to or more than 1 nm in order to keep the ohmic contactness with the n-type nitride semiconductor layer 2. More preferably, the thickness of the Cr layer is equal to or more than 1.5 nm. Furthermore, it is preferable that the thickness of the Cr layer is equal to or more than 2 nm in order not to make the dispersion of the Rh from the Rh layer to the upper Au layer too much. On the other hand, if the Cr layer is too thick, the contact surface of the translucent electrode 6 is difficult to be affected by the Rh layer, whereby the ohmic contactness with the p-type nitride semiconductor layer 4 is decreased. Therefore, it is preferable that the thickness of the Cr layer is less than 9 nm and more preferably equal to or less than 6 nm. Furthermore, it is more preferable that the thickness of the Cr layer is equal to or more than 4.5 nm.

The Cr layer may be a layer which is comprised of an alloy including Cr. By using Cr or an alloy including Cr at the lowest layer of the pad electrode, the adhesiveness between the translucent electrode 6 and the pad electrode becomes stronger. It is to be noted that the lowest layer of the pad electrode may be a layer which is comprised of Rh or an alloy including Rh. A layer comprised of Rh or an alloy including Rh can obtain an effect similar to the layer comprised of Cr or an alloy including Cr. Especially, a layer comprised of CrRh alloy is preferable because the effect of high reflection efficiency of Rh in addition to the adhesiveness of Cr can be obtained.

The Pt layer is a layer for improving adhesiveness to the translucent electrode 6 by diffusing Pt to the Cr layer. By diffusing Pt to the Cr layer, a Cr—Pt alloy layer is formed in the vicinity of the interface between the Cr layer and the Pt layer. With the Cr—Pt alloy layer, the adhesiveness to the translucent electrode 6 is improved. Furthermore, the ohmic contactness to the p-type nitride semiconductor layer 4 is improved by diffusing Pt to the Cr layer adequately. The thickness of the Pt layer is preferably equal to more than the thickness obtained by multiplying the thickness of the Cr layer by one. More preferably, the thickness of the Pt layer is equal to or more than the thickness which is obtained by multiplying the thickness of the Cr layer by five. More specifically, it is preferable that the thickness is designed to be equal to or more than 10 nm so that the thickness of the Pt layer can be easily controlled at the time of manufacturing. On the other hand, even if the thickness is designed to be more than 100 nm the effect is not improved, and productivity thereof is decreased. In addition to this, Pt may be dispersed to the Au layer to decrease the bondability of the Au layer. Therefore, it is preferable that the thickness of the Pt layer is designed to be equal to or less than 100 nm. More preferably, the thickness thereof is equal to or less than 50 nm.

The Ru layer is a layer stacked between the Pt layer and the Au layer. If the Au layer is directly laminated on the Pt layer, Pt is dispersed to decrease the bondability of the Au layer. In other words, the Ru layer is provided to suppress the dispersion of Pt to the Au layer. Especially, the Ru layer suppresses the dispersion of Pt to the AU layer in the thermal process for diffusing Pt to the Cr layer from the Pt layer to prevent the dispersion of Pt to the AU layer. It is preferable that the thickness of the Ru layer is equal to or more than 50 nm although it depends on the thickness of the Pt layer and the AU layer and the conditions of the thermal process. By designing the thickness of the Ru layer to be equal to or more than 50 nm, it is possible to suppress Pt from being dispersed to the Au layer even if Pt is dispersed to the Ru layer when the thermal process is carried out to disperse Pt to the Cr layer. The thickness of the Ru layer is more preferably equal to or more than 60 nm. On the other hand, even if the thickness of the Ru layer is designed to be more than 90 nm, the effect is not improved and the productivity is decreased. Therefore, the thickness of the Ru layer is preferably equal to or less than 90 nm.

Each of these layers may be formed by a publicly known method such as a vapor deposition, sputtering or the like, and is preferably formed continuously and laminated on one another. Further, the plain view shape of the pad electrodes 7 (7n, 7p) is not limited, and may be formed in any shape (refer to FIG. 1A, for example) by a liftoff process or etching by using photolithography. The larger the bottom area of the pad electrode 7 is, the larger the area of the pad electrode 7 which comes in contact with the translucent electrode 6 becomes, which makes the adhesiveness of the pad electrode 7 better. It is to be noted that the thickness of each layer may be adjusted by the film forming condition of a spattering apparatus.

Protection Layer

The protection layer 9 covers exposed surfaces (the upper surface and the side walls) of the nitride semiconductor layers 2, 3, 4 and the translucent electrode 6 of the nitride semiconductor element 10 to form a protection and antistatic film of the nitride semiconductor element 10. More specifically, areas of the pad electrodes 7n, 7p other than peripheral portions of the upper surface of the pad electrodes 7n, 7p are designed to be areas for bonding (a bonding part), and the protection layer is formed over entire surfaces of the pad electrodes 7n, 7p other than the bonding part. The protection layer 9 is comprised of an oxide such as Si, Ti, Ta which is an insulating film having light translucency. The protection layer 9 may be formed by a known method such as a vapor deposition or sputtering. The thickness of the film is not particularly limited, however, it is preferable that the thickness of the protection layer 9 is designed to be 100 to 1000 nm.

Since Au which constitutes the top surfaces of the pad electrodes 7n, 7p does not have good adhesiveness to the protection layer 9 which is comprised of an oxide, there is a risk that the protection layer 9 is separated from an end of the bonding part. In order to prevent this, it is preferable that a film such as Ni is formed as an adhesive layer at the peripheral portion (an area directly below the protection layer 9) of the upper surface of the Au layer. Furthermore, in a case where the adhesive layer is formed of Ni, if Ni is dispersed to the Au layer from the adhesive layer, the bondability of the Au layer is decreased. To prevent this, it is preferable to form a barrier layer below the adhesive layer. The barrier layer may be formed, for example, of W, Ru or Ir. It is preferable that the barrier layer is formed of W, similarly to the W layer of the pad electrode 7. The thickness of the barrier layer and the adhesive layer are not particularly limited, however, it is preferable that the thickness of the barrier layer is in a range of 20 nm to 50 nm and the thickness of the adhesive layer is in a range of 1 nm to 20 nm. The two layers of the barrier layer and the adhesive layer (W/Ni layer, for example) are referred to as an under layer as appropriate. The under layer may be formed by a known method such as vapor deposition, sputtering, etc., similarly to the metallic films which constitute the pad electrodes 7n, 7p. It is preferable that the under layer is formed continuously from the Au layer (i.e. continuously from the Ti layer).

Manufacturing Method of the Semiconductor Element

Next, an example of a manufacturing method of the semiconductor element according to the present invention is described by taking as an example a manufacturing method of the nitride semiconductor element according to the embodiment described above.

Firstly, a first buffer layer, a second buffer layer, a n-side contact layer, a third buffer layer, and a n-side multilayer film layer that constitute a n-type nitride semiconductor layer 2 are grown on a sapphire substrate used as the substrate 1 by using a MOVPE reaction apparatus, and then the active layer 3 is formed on this n-side multilayer film layer. After that, the p-side multilayer film layer and the p-side contact layer which constitute the p-type nitride semiconductor layer 4 are grown on the active layer 3 in this order. Then, the substrate 1 (referred to as wafer, hereinafter) on which each layer of the nitride semiconductor has been grown is subjected to annealing treatment at the temperature of 600 to 700° C. in the nitrogen atmosphere in the treatment room of the apparatus to reduce the resistance of the p-type nitride semiconductor layer 4.

Next, as a contact area for connecting the n-side electrode (n-side pad electrode) 7n, a part of the n-type nitride semiconductor layer 2 is exposed. More specifically, a mask having a predetermined shape is formed by a photo resist on the wafer after the annealing treatment and then, the p-type nitride semiconductor layer 4, the active layer 3, and further, the n-side multilayer film layer of the n-type nitride semiconductor layer 2 and the third buffer layer are removed by responsive ion etching (RIE) to expose the n-side contact layer. After the etching, the resist is removed. It is to be noted that the peripheral portion (scribe area) of the nitride semiconductor element 10 (a tip) may be etched at the same time when the contact area is exposed.

After that, an ITO film is formed as the translucent electrode 6 over the entire surface of the wafer by the sputtering device. A mask having a shape corresponding to the plain view shape of the p-type nitride semiconductor layer 4 (see FIG. 1A), which is arranged below the ITO film, is formed on the ITO film by a photo resist. The wafer is then subjected to an etching process to form the translucent electrode 6 on the p-type nitride semiconductor layer 4. The wafer is further subjected to an etching process by which a part of the translucent electrode 6 where the p-side pad electrode 7p is provided is removed to form the recessed part C. Thus, the bottom surface A of the recessed part C of the translucent electrode 6 is designed to be a predetermined thickness. After that the resist is removed. Then, the wafer is subjected to an annealing treatment at the temperature of approximately 500° C. in the nitrogen atmosphere to improve the ohmic contactness of the translucent electrode 6 (ITO film) with the p-type nitride semiconductor layer 4 and the ohmic contactness of the exposed part of the n-type nitride semiconductor layer 2 at the contact area with the n-side pad electrode 7n.

Next, a mask is formed of which some areas are removed corresponding to predetermined areas of the exposed n-type nitride semiconductor layer 2 and the translucent electrode 6 by a photo resist. At this time, the mask is formed so that the bottom surface A of the recessed part C of the translucent electrode 6 is exposed. Six metallic films of Ti, Rh, W and Au that constitute the pad electrodes 7n, 7p and W, Ni that constitute the under layer are continuously formed on the mask by using the sputtering device with each film having a predetermined film thickness. After that, when the resist is removed together with the metallic films stacked thereon (a lift off method), the n-side pad electrode 7n and the p-side pad electrode 7p are formed in the predetermined areas (a lift off method), and the two films of W, Ni having the same plain view shape as those of the n-side pad electrode 7n and the p-side pad electrode 7p are laminated on the n-side pad electrode 7n and the p-side pad electrode 7p.

Next, the wafer is subjected to the thermal process (annealing treatment) in the nitrogen atmosphere in order to improve the ohmic contactness of the ITO film. It is preferable that the temperature of the thermal process is equal to or more than 280° C. If the temperature is too high, the nitride semiconductor layers 2, 3, 4 are deteriorated due to the heat, whereby the ohmic contactness of the n-type nitride semiconductor layer 2 and the p-type nitride semiconductor layer 4 may also be decreased, and the luminance intensity of the nitride semiconductor element 10 may be decreased. Therefore, the temperature of the thermal process is preferably equal to or less than 500° C. The treatment time may be set in accordance with the temperature and the thickness of the Ti layer, etc. however, the treatment time is preferably in a range of 10 to 20 minutes.

After that, the $SiO_2$ film is formed over the entire surface of the wafer as the protection layer 9 by using the sputtering device. A mask of which some areas are removed corresponding to the predetermined areas (bonding areas) of the W, Ni films on the pad electrodes 7n, 7p is then formed by photo resist. After the SiO₂ film is etched, the resist is removed. The Ni, W layers are further etched by using the SiO₂ film (the protection layer 9) as a mask to expose the Au layer at the bonding area.

Then, the wafer is separated by scribing or singulation, etc. to obtain one nitride semiconductor element 10 (a tip). Further, before separating the wafer into chips, the substrate 1 may be ground (back grind) from the back surface of the wafer to make the thickness of the substrate 1 to be a desired thickness.

A manufacturing method of the pad electrode of the semiconductor element according to the present invention by the above described processes makes it possible to simultaneously form the pad electrodes on the p-side and the n-side for the nitride semiconductor element according to the embodiment, whereby the productivity is improved.

Second Embodiment

Figure 4:
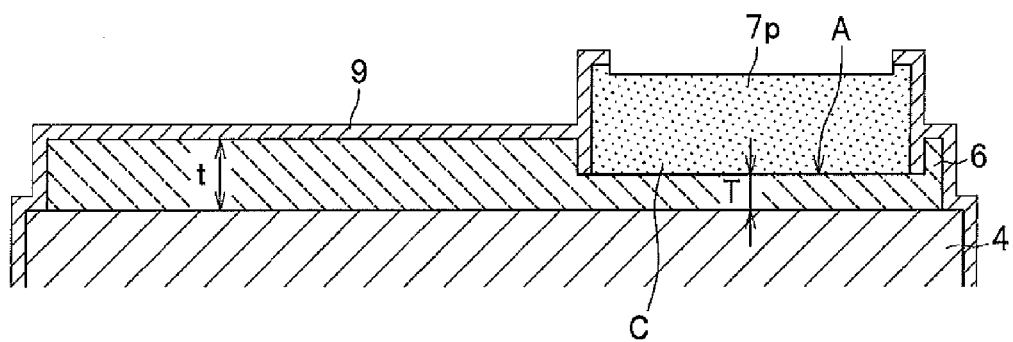
FIG. 4 is an enlarged cross sectional view schematically showing the structure of the translucent electrode in the nitride semiconductor element according to a second embodiment of the present invention.
Figure 5:
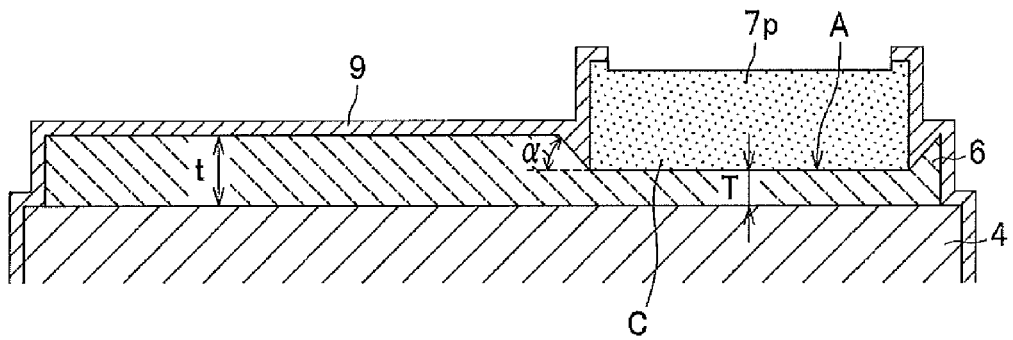
FIG. 5 is an enlarged cross sectional view schematically showing the structure of the translucent electrode in the nitride semiconductor element according to a second embodiment of the present invention.

Next, a light emitting element according to the second embodiment is described. FIGS. 3 to 5 are enlarged cross sectional views which schematically show the structure of a translucent electrode of a nitride semiconductor element according to the second embodiment of the present invention. The semiconductor element according to the second embodiment is substantially the same as the semiconductor element according to the first embodiment except that the space S is formed between a side surface of the p-side pad electrode 7p and a side surface of the translucent electrode 6 which constitutes the recessed part C or except that the entire side surface of the p-side pad electrode 7 is covered by the protection layer 9. It is to be noted that the thickness t in the second embodiment represents a length (thickness) from the bottom surface of the translucent electrode 6 to the highest position of the side surface of the recessed part C.

The light emitting element according to the second embodiment includes the translucent electrode 6 which is formed on the p-type nitride semiconductor layer 4 and the p-side pad electrode 7p which is formed in a part of the translucent electrode 6. As shown in FIGS. 3 and 4, the area of the bottom surface A of the recessed part C of the translucent electrode 6 is larger than that of the bottom surface of the pad electrode 7p. Further, as shown in FIG. 3, a side surface of the p-side pad electrode 7p does not come in contact with a side surface of the recessed part C of the translucent electrode 6, and the space S is formed therebetween. More specifically, a part of the side surface of the p-side pad electrode 7p which is buried in the translucent electrode 6 is spaced from a side surface of the translucent electrode 6 which is opposed to the part of the side surface of the p-side pad electrode 7p. Further, as shown in FIG. 4, the protection layer 9 may be provided between the side surface of the p-side pad electrode 7p and the side surface of the recessed part C. In short, only the bottom surface of the p-side pad electrode 7p comes in contact with the translucent electrode 6.

With this configuration, since the area of the p-side pad electrode 7p and the translucent electrode 6 which comes in contact with each other becomes small, the area of the p-side pad electrode 7p on which light which has been transmitted through the translucent electrode 6 hits (the area of the interface between the translucent electrode 6 and the p-side pad electrode 7p) becomes also small, whereby the light absorption by the p-side pad electrode 7p can be suppressed. Furthermore, when the side surface of the recessed part C of the translucent electrode 6 is substantially vertical, the amount of the light is increased which does not hit the side surface of the p-side pad electrode 7p and is reflected by the side surface of the recessed part C of the translucent electrode 6. Further, in a case where the protection layer 9 is a translucency film having reflective index smaller than that of the translucent electrode 6 (in a case where the protection layer 9 is formed of SiO₂ and the translucent electrode 6 is formed of ITO, for example), the light becomes to be easily transmitted from the translucent electrode 6 to the protection layer 9, whereby the light output is improved.

Furthermore, as shown in FIG. 5, the side surface of the recessed part C of the translucent electrode 6 may have a tapered angle α which is defined with reference to the bottom surface of the recessed part C. More specifically, the side surface of the recessed part C may be formed to be inclined up-outward from the bottom surface A of the recessed part C. It is to be noted that in a case where the side surface of the recessed part C is such an inclined surface, the thickness t represents a thickness from the bottom surface of the translucent electrode 6 to the highest position of the inclined surface of the recessed part C having the tapered angle α. In this case, it is preferable that the tapered angle α is less than 90°. More preferably, the tapered angle α is equal to or less than 45°. If the tapered angle is less than α 90°, the multiple reflection of light which is multiply reflected and is propagated in the transverse direction in the translucent electrode 6 can be suppressed by changing the reflection angle of the light at the side surface of the recessed part C. When the side surface of the recessed part C has the tapered angle α, the light can be transmitted outside from the translucent electrode 6 at a higher rate since the light hits the side surface of the recessed part C in a comparatively smaller incident angle. Further, it is also possible to increase the light which goes upward (a light emission observing direction) from the side surface of the recessed part C, whereby the luminance intensity at the side surface of the recessed part C can be enhanced. It is to be noted that the tapered angle α may be provided either with the area of the bottom surface A of the recessed part C being larger than the area of the bottom surface of the pad electrode 7p or with the area of the bottom surface A of the recessed part C being not larger than the area of the bottom surface of the pad electrode 7p. The tapered angle α may be controlled by conditions of the etching of a mask (the cross sectional shape of the mask, a material of the mask, or selection of an etching gas) when a pattern etching is performed, however, the tapered angle α is controlled by a wet etching in the present embodiment.

It is to be noted that as shown in FIG. 3, in the semiconductor element in which the protection layer 9 is not provided between the side surface of the recessed part C and the p-side pad electrode 7p, light which is totally reflected to be extracted is increased compared with the semiconductor elements having the structures shown in FIGS. 4 and 5. If a gap between the side surface of the p-side pad electrode 7p and the side surface of the recessed part C is air or vacuum as shown in FIG. 3, since the refractive index of the air or vacuum is less than that of the protection layer 9, the light is totally reflected which is incident on the gap S and has an angle more than approximately 28° with respect to a line vertical to the tangent line of the interface between the gap S and the side surface of the recessed part C. Thus, the light is not absorbed by the pad electrode 7p. In other words, a critical angle is approximately 44° in the case of the ITO film/the protection layer (SiO₂) while a critical angle is approximately 28° in the case of the ITO film/air. Thus, light having the angle of approximately 28° to 44° can be extracted.

It is to be noted that "44 degree" and "28 degree" are critical angles which are derived from Snell's law. More specifically, the critical angles are the angle in which light coming in to the interface between the $SiO_2$ layer (or air) and the ITO layer. Here, the critical angles are calculated by assuming that reflective index of air is 1, that of $SiO_2$ is 1.45 and that of ITO is 2.1, respectively. Further, a structure may be employed in which the protection layer 9 does not cover the upper surface and the side surface of the pad electrode 7p but covers only the upper surface of the translucent electrode 6.

Third Embodiment

Figure 6:
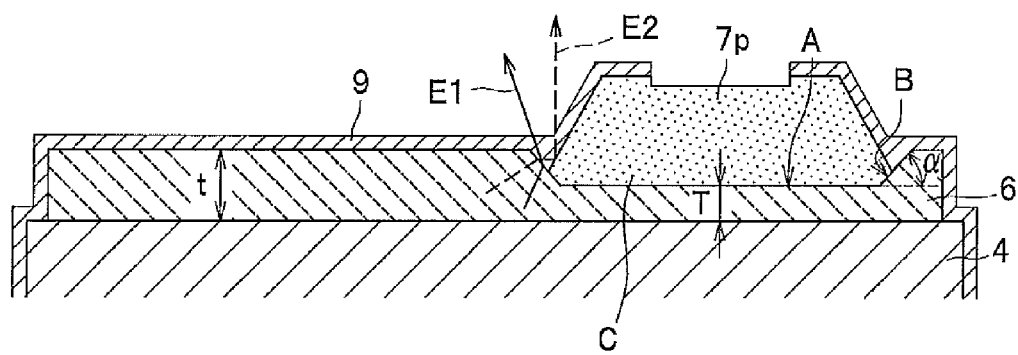
FIG. 6 is an enlarged cross sectional view schematically showing the structure of a translucent electrode and a pad electrode in the nitride semiconductor element according to the third embodiment of the present invention.

Next, a light emitting element according to a third embodiment of the present invention is described. FIG. 6 is an enlarged cross sectional view schematically showing a structure of a translucent electrode and a pad electrode in the nitride semiconductor element according to the third embodiment of the present invention. The semiconductor element according to the third embodiment is substantially the same as those of the first and second embodiments except that the side surface of the p-side pad electrode 7p is formed to be an inclined surface and the inclined surface is inclined inner upward from the circumferential edge of the base end of the p-side pad electrode 7p and a part of the side surface (a covered portion B) of the recessed part C is covered by the p-side pad electrode 7p. The thickness t of the third embodiment represents a thickness from the bottom surface of the translucent electrode 6 to the highest position of the side surface of the recessed part C. More specifically, the thickness t represents a thickness from the bottom surface of the translucent electrode 6 to the highest position of the inclined surface of the recessed part C having the tapered angle α.

The light emitting element according to the third embodiment includes a translucent electrode 6 which is formed on the p-type nitride semiconductor layer 4 and the p-side pad electrode 7p which is formed on a part of the translucent electrode 6. As shown in FIG. 6, the side surface of the pad electrode (the p-side pad electrode 7p) may be inclined inner upward from the circumferential edge of the base end of the p-side pad electrode 7p. The inclined surface of the pad electrode may be formed to be a flat surface or a curved surface.

Here, the circumferential edge of the base end of the p-side pad electrode means the circumferential edge of the bottom surface of the p-side pad electrode 7p. If a part of the side surface of the recessed part C is covered by the p-side pad electrode 7p as described later, the circumferential edge of the base end of the p-side pad electrode means a part of the side surface of the p-side pad electrode 7p which comes in contact with the side surface of the recessed part C. Further, if the side surface of the recessed part C is not covered by the p-side pad electrode 7p, the circumferential edge of the base end of the p-side pad electrode means a part of the side surface of the p-side pad electrode 7p which comes in contact with the bottom surface A of the recessed part C. More specifically, the circumferential edge of the base end of the p-side pad electrode 7p is a part of the circumferential edge of the bottom surface of the p-side pad electrode 7p which comes in contact with the recessed part C. Further, "upward from the circumferential edge of the base end" means that upward from the p-type nitride semiconductor layer 4 (upward from the side of the substrate 1). Specifically, the side surface of the p-side pad electrode 7p is inclined upward from the part where the base end of the side surface is in contact with the recessed part C in such a manner that the cross sectional area of the p-side pad electrode 7p (or the width in the plain view shape) becomes smaller as it goes upward from the side of the p-type nitride semiconductor layer 4. Further, it is to be noted that in a case where the p-side pad electrode 7p is formed in a circular shape in a plain view (see FIG. 1A), the p-side pad electrode 7p is formed to be in a frustum of circular cone shape or a dome shape.

With the side surface of the p-side pad electrode 7p being inclined, light from the light emitting element becomes difficult to be hit on the p-side pad electrode 7p, whereby it is possible to suppress the light absorption by the p-side pad electrode 7p. Further, even if some of lights hits the side surface of the p-side pad electrode 7p among lights from the light emitting element (arrows E1 and E2), the light is reflected upward (the arrow E2). Therefore, the light which has been hit on the side surface of the p-side pad electrode 7p can be efficiently used. Furthermore, since the side surface of the p-side pad electrode 7p is inclined, coatability of the protection layer 9 is improved. More specifically, it is easy to cover the side surface of the p-side pad electrode 7p with the protection layer 9 and it is also easy to make the protection layer 9 to be closely in contact with the side surface of the p-side pad electrode 7p.

Further, a part of the side surface of the recessed part C may be covered by the p-side pad electrode 7p to form a covered portion B as shown in FIG. 6. Here, the side surface of the recessed part C of the translucent electrode 6 has a tapered angle α which is defined with reference to the bottom surface of the recessed part C. More specifically, the side surface of the recessed part C is formed to be an inclined surface, and the inclined surface is inclined upper outward from the bottom surface A of the recessed part C. A part of the inclined side surface of the recessed part C is covered by the p-side pad electrode 7p to form the covered portion B. More specifically, the covered portion B is "a part of the side surface of the recessed part C". With the above structure, it is not necessary to accurately match the width of the p-side pad electrode 7p with that of the bottom surface A of the recessed part C. Thus, it becomes easy to mount the p-side pad electrode 7p to the recessed part C. It is to be noted that a part of the side surface of the recessed part C may be covered by the p-side pad electrode 7p even if the side surface of the recessed part C is not inclined (the embodiments shown in FIGS. 3 and 4).

Examples

Next, an example in which the effect of the present invention is confirmed is described in detail by comparing the example with a comparative example in which the requirements of the present invention are not met. It is to be noted that the present invention is not limited to this example.

The Manufacturing of the Semiconductor Element

With the method described below, a nitride semiconductor element having a structure shown in FIG. 1 is manufactured. It is to be noted that the protection layer is not provided. Nitride semiconductors, each of which constitutes a buffer layer, an n-type nitride semiconductor layer, an active layer, and a p-type nitride semiconductor layer, are sequentially grown on a substrate formed of sapphire (C-face) of 3 inch φ by a MOVPE reaction apparatus. The substrate (may be referred to as a wafer, hereinafter) on which each layer of the nitride semiconductors is grown is then subjected to annealing treatment at 600° C. in an nitrogen atmosphere in the treatment room of the MOVPE reaction apparatus.

The wafer is then taken out from the treatment room, and a resist mask having a predetermined shape is formed on the p-type nitride semiconductor layer. After that, the wafer is etched by using a RIE (reactive ion etching) apparatus until the p-type nitride semiconductor layer, the active layer, the n-side contact layer of the n-type nitride semiconductor layer are exposed as shown in FIG. 1B, and then the resist is removed.

The wafer is then dipped in a Buffered Hydrogen Fluoride (BHF, hydrofluoric acid/ammonium fluoride solution) at ambient temperature, and then the ITO film is formed by a sputtering device. More specifically, electric current is discharged by the sputtering device in Ar atmosphere with an oxide target comprised of a sintered object of $In_2O_3$ and $SnO_2$ so that the ITO film is formed on the wafer. Then, a resist mask is formed in a shape such that the ITO film remains on substantially the entire surface of the p-type nitride semiconductor layer, and the wafer is etched. At this time, a part of the translucent electrode where the p-side pad electrode is provided is removed by the etching to form a recessed part. The bottom surface of the recessed part is adapted to have a predetermined ITO film thickness. After that, the resist is removed. The wafer is then subjected to annealing treatment at 500° C. in the nitrogen atmosphere to improve the ohmic contact property of the ITO film and form a translucent electrode.

Next, a resist mask is formed of which some areas are removed corresponding to a predetermined area of a n-side electrode contact area on the n-type nitride semiconductor layer (n-side contact layer) and a predetermined area of the translucent electrode. At this time, the mask is formed in such a manner that the bottom surface of the recessed part of the translucent electrode is exposed. Then, the metallic films (Ti, Rh, W, Au) for the pad electrode are sequentially formed on the wafer by using the sputtering device. It is to be noted that the pad electrode is formed to have the structure shown in Table 1. Then, the resist is removed (liftoff) to form the multi layer film of the n-side and p-side pad electrodes having the plain view shapes (see FIG. 1A).

As semiconductor elements used for an accelerated wire bonding test described later, semiconductor elements are manufactured in which the thickness of the ITO film other than the recessed part is 170 nm, the thickness of the bottom surface of the recessed part is made to be those shown in Table 1 and the ratio of the thickness of the bottom surface of the recessed part to the thickness of the ITO film other than the recessed part is made to be those shown in Table 1. Further, as semiconductor elements used for a sheet resistance measuring test described later, semiconductor elements are manufactured in which the thickness of the bottom surface of the recessed part of the ITO film is the same as that of the ITO film other than the recessed part, wherein the thickness is varied to be 40 nm, 80 nm, 120 nm and 170 nm. Furthermore, in order to obtain the histograms of the luminance intensity of semiconductor elements, semiconductor elements are prepared in which the thickness of the bottom surface of the recessed part of the ITO film is the same as that of the ITO film other than the recessed part, wherein the thickness is varied to be 80 nm and 170 nm. Semiconductor elements are also manufactured in which the thickness of the ITO film other than the recessed part is 170 nm and the thickness of the bottom surface of the recessed part of the ITO film is 80 nm. For the sheet resistance measuring test, semiconductor elements are used in which the structure of the pad electrode is "Ti/Rh/W/Au".

After that, the wafer is subjected to annealing treatment at 400° C. in the nitrogen atmosphere in an annealing oven for ten minutes to make a nitride semiconductor element used for the tests. It is to be noted that the under layer and the protection layer are not provided because they are not directly related to the peeling of the electrode and the test should not be affected by them in any means.

The accelerated wire bonding test for checking the peeling of the electrode when an external connection member is connected to the electrode and the sheet resistance measuring test for checking the relationship between the ITO film thickness and the sheet resistance are carried out on the nitride semiconductor elements manufactured as described above. It is to be noted that different samples are prepared for the accelerated wire bonding test and the sheet resistance measuring test, respectively, and the tests are carried out independently.

Accelerated Wire Bonding Test

As for the samples shown in Table 1, the adhesiveness between the ITO film and the p-type nitride semiconductor layer is tested by the accelerated wire bonding test. Conditions of the test are as follows. A wire bonding device (FB-150DGII made by KAIJO) is used to bond a wire of (φ30 μm to the pad electrode, and the number of samples in which the ITO film is peeled off from the p-type nitride semiconductor layer and the number of samples in which the ITO film is broken even if the ITO film is not peeled off from the p-type nitride semiconductor layer is counted, and the counted number is referred to as "a peeled number".

Figure 8:
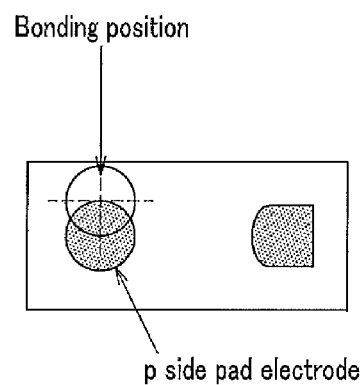
FIG. 8 is a schematic view of a semiconductor element for explaining a condition of an accelerated wire bonding test carried out on a semiconductor element of the embodiment of the present invention.

It is to be noted that the size of the semiconductor element is 420 μm×240 μm, the pad diameter of the p-side pad electrode is 90 μm and the protection layer is not provided. The test is performed by making the wire bonding device set in such a manner that the load applied when a wire is bonded is set to be 40 gf, which is higher than an normal value, and a position where the wire is bonded is displaced from a normal position (i.e. a position which is displaced from the pad diameter of the p-side pad electrode as shown in FIG. 8) so that an accelerated peeling test can be performed. The sample number (evaluation number) is set as shown in Table 1. The relationship between the ITO film thickness and the peeling rate is shown in Table 1.

TABLE 1

| Ratio [%] of the thickness of the recessed part's bottom surface to the thickness of the entire ITO film | ITO film thickness | Electrode structure | 420 × 240 (Φ90 μm) | | |
|---|---|---|---|---|---|
| | | | Peeled rate [%] | Peeled number [pcs] | Evaluation number [pcs] |
| 10% | 17 | Ti/Rh/W/Au | 0.00% | 0 | 500 |
| 20% | 34 | | 0.00% | 0 | 500 |
| 30% | 51 | | 0.00% | 0 | 500 |
| 35% | 60 | | 0.00% | 0 | 1000 |
| 47% | 80 | | 0.00% | 0 | 1500 |
| 50% | 85 | | 0.60% | 3 | 500 |
| 53% | 90 | | 0.40% | 2 | 500 |
| 56% | 95 | | 0.00% | 0 | 500 |

TABLE 1-continued

| Ratio [%] of the thickness of the recessed part's bottom surface to the thickness of the entire ITO film | ITO film thickness | Electrode structure | 420 × 240 (Φ90 μm) | | |
|---|---|---|---|---|---|
| | | | Peeled rate [%] | Peeled number [pcs] | Evaluation number [pcs] |
| 59% | 100 | | 0.90% | 13 | 1500 |
| 71% | 120 | | 5.10% | 76 | 1500 |
| 100% | 170 | | 9.10% | 1547 | 25000 |

As shown in Table 1, in the sample where the ratio of the ITO film thickness of the bottom surface of the recessed part to the thickness of the entire ITO film is equal to or less than 70%, the peeling rate is 0.9% at the maximum. Thus, it is understood that the peeling of the electrode can be suppressed in the sample.

Sheet Resistance Measuring Test

Four samples whose thickness of a part of the ITO film other than the recessed part is respectively set to be 40 nm, 80 nm, 120 nm and 170 nm are applied electric current of 20 mA, 70 mA and 100 mA. Then, the sheet resistance of the ITO film is measured, and the luminance intensity distribution of the samples is investigated. Further, current of 20 mA is applied to the following three samples; the first sample in which the thickness of the bottom surface of the recessed part of the ITO film and the thickness of a part of the ITO film other than the recessed part are made to be the same, wherein the thickness is 80 nm; the second sample in which the thickness of the bottom surface of the recessed part of the ITO film and the thickness of a part of the ITO film other than the recessed part are made to be the same, wherein the thickness is 170 nm; and the third sample in which the thickness of the ITO film other than the recessed part is made to be 170 nm and the thickness of the bottom surface of the recessed part of the ITO film is made to be 80 nm. Thus, the luminance intensity distributions and the histograms of the luminance intensity for these samples are obtained. The sheet resistance is measured by a four terminal four probe method (name of an apparatus: a resistivity meter MCP-T600 manufactured by Mitsubishi Chemical Corporation). Further, the luminance intensity distribution is obtained by actually applying current to the samples and image of the samples emitting light is shot and converted to be intensity distribution by a CCD camera (Program name; LEPAS11).

Figure 9:
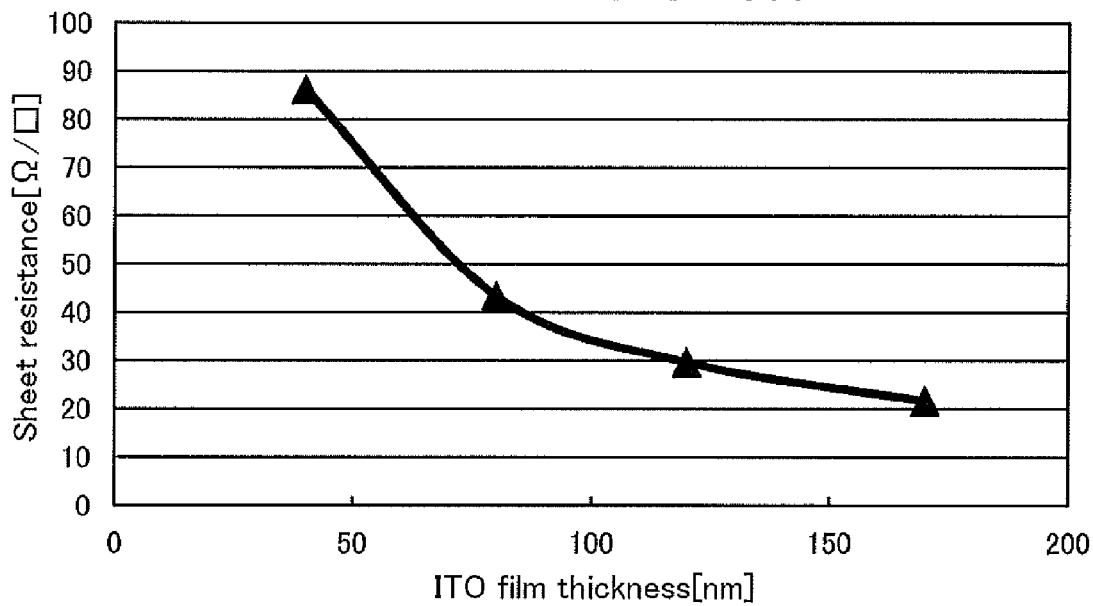
FIG. 9 is a graph showing the correlation of an ITO film thickness and a sheet resistance when current of 20 mA is applied to the semiconductor element of the embodiment of the present invention.
Figure 10:
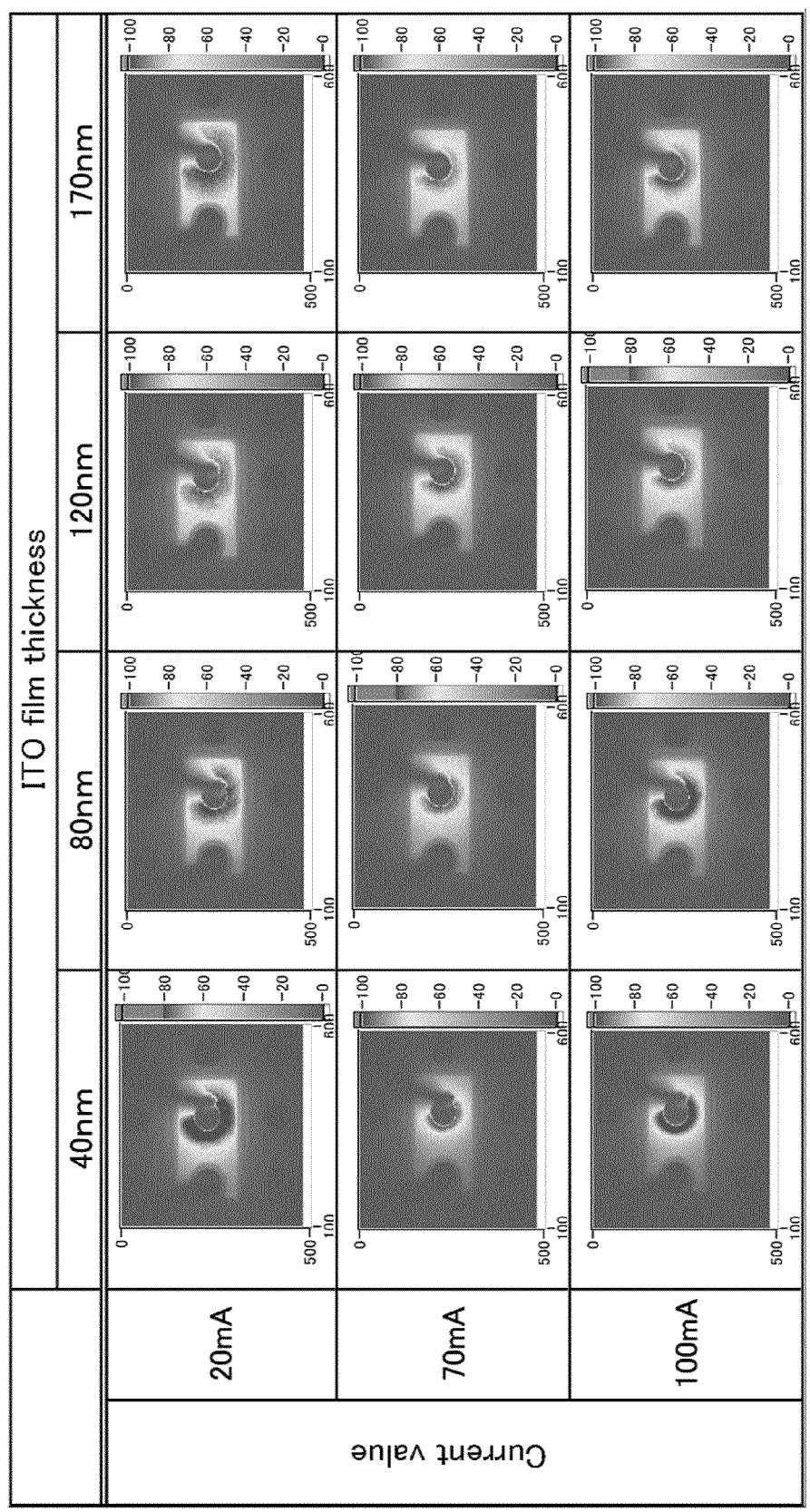
FIG. 10 is images showing luminance intensity distributions in examples of the semiconductor elements.
Figure 11:
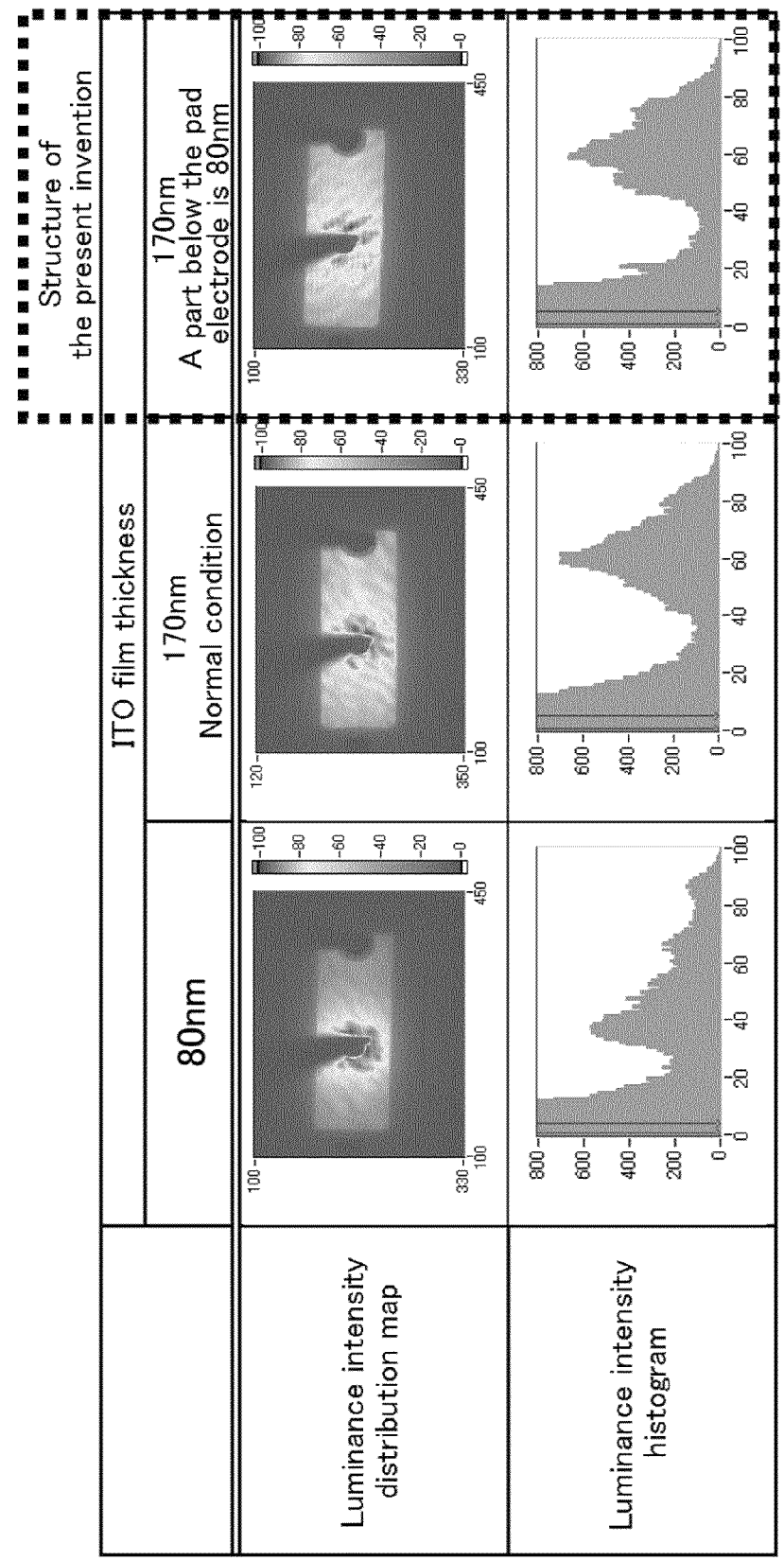
FIG. 11 is an image showing luminance intensity distributions and histograms of the luminance intensity of examples of semiconductor elements when current of 20 mA is applied to the semiconductor elements.
Figure 12:
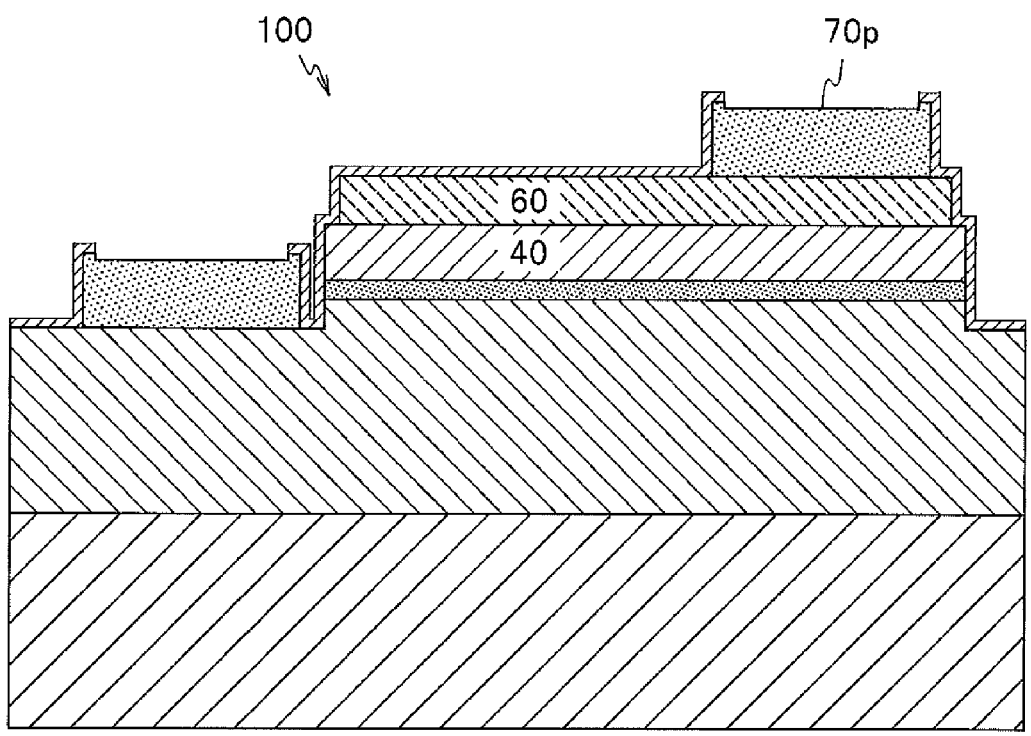
FIG. 12 is a schematic view showing a structure of a conventional semiconductor element (a nitride semiconductor element).

The relationship between the thickness of the ITO film and the sheet resistance is shown in FIGS. 9 to 11. FIG. 9 is a graph showing the correlation of the thickness of the ITO film and the sheet resistance when the current of 20 mA is applied to the samples. FIG. 10 shows images showing the luminance intensity distributions of the samples. FIG. 11 shows images showing the luminance intensity distributions of the samples and the histograms of the luminance intensity of the samples when the current of 20 mA is applied to the samples. In the graphs showing the luminance intensity distribution shown in FIGS. 10 and 11, the right side vertical axis represents the luminance intensity (%) where the brightest part is indicated as 100%. The left side vertical axis represents the coordinate in the y direction and the lateral axis represents the coordinate in the x direction. In the histograms of the luminance intensity shown in FIG. 11, the vertical axis represents a detected amount (an arbitral value) and the lateral axis represents the luminance intensity (%).

The sheet resistance becomes smaller as the thickness of the ITO film becomes greater as shown in FIG. 9. Specifically, the sheet resistance can be made equal to or less than approximately 40Ω/□ by making the thickness of the ITO film be equal to or more than 80 nm. As shown in the luminance intensity distribution shown in FIG. 10, current becomes easy to be diffused as the thickness of the ITO film is made greater. Especially, this is clearly shown when the current of 20 mA is applied to the samples. Further, light is emitted too strong in an area around the pad electrode and current is not diffused well in the sample in which the thickness of the ITO film is 40 nm. On the other hand, current is diffused well in the sample in which the thickness of the ITO film is 80 nm, and current is diffused better in the sample in which the thickness of the ITO film is 170 nm, whereby the distribution of the light is made more even. As shown in FIG. 11, the histograms of the sample having the structure of the preset invention and the sample in which the thickness of the ITO film is 170 nm (a normal condition) are substantially the same, however, only in the sample in which the thickness of the ITO film is 80 nm, the peak value is lower than those of the above two sample. From this, current is diffused better and the distribution of the light becomes more even in the sample having the ITO film thickness of 170 nm compared with the sample having the ITO film thickness of 80 nm.

As described above, it is possible to prevent the peeling of the translucent electrode by making the thickness of the bottom surface of the recessed part of the translucent electrode be greater than 0% of and equal to or less than 70% of that of a part of the translucent electrode other than the recessed part. Further, it is possible to lower the sheet resistance by making the thickness of a part of the translucent electrode other than the recessed part be a predetermined value, whereby the diffusion of the current can be improved.

The embodiments and examples of the present invention have been described as above, however, the present invention is not limited to these described above, and the scope of rights of the present invention shall be broadly interpreted based on the scope of the claims. It is also to be understood that the preset invention may be modified and varied based on the above description.

Figure 7:
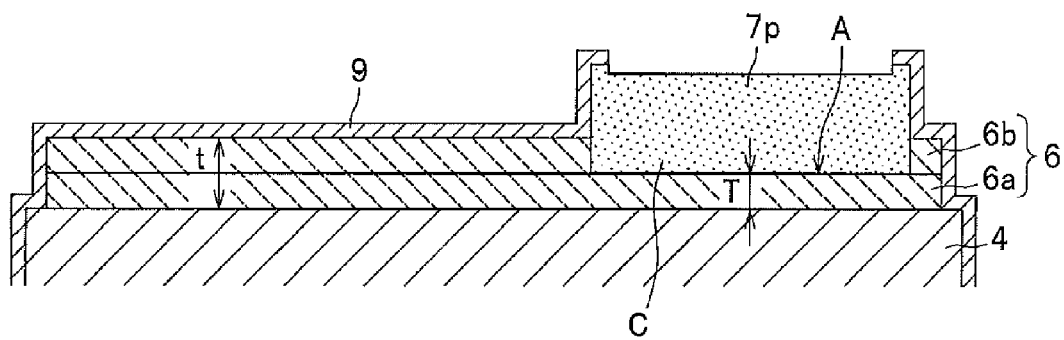
FIG. 7 is an enlarged cross sectional view schematically showing the structure of a translucent electrode in a nitride semiconductor element according to other embodiments of the present invention.

As another embodiment, for example, the recessed part C may be formed in the translucent electrode 6 by forming two layers (translucent electrodes 6a and 6b) wherein the translucent electrode 6a is the layer of the bottom surface A of the recessed part C of the translucent electrode 6, as shown in FIG. 7 so that the thickness T of the bottom surface A of the recessed part C of the translucent electrode 6a is different from thickness t of a part of the translucent electrode 6 other than the recessed part C. In this case, the recessed part C is formed in the translucent electrode 6 by firstly forming a layer of the translucent electrode 6a on the p-type nitride semiconductor layer 4 and secondly forming a layer of the translucent electrode 6b on a part of the translucent electrode 6a where the p-side pad electrode 7p is not provided.

Furthermore, the translucent electrode is provided on the p-type nitride semiconductor layer in the semiconductor element of the above described embodiment (see FIG. 1), however, the translucent electrode may be also formed on the n-type nitride semiconductor layer. In this case, similarly to the p-side electrode, the thickness of the bottom surface of the recessed part of the translucent electrode for the n-side electrode should be more than 0% of and equal to or less than 70% of that of a part of the translucent electrode other than the recessed part. The structure of the semiconductor element may be other structures as long as it does not deviate from the spirit of the present invention.

As described above, a semiconductor element which realizes even luminance intensity and a low driving voltage while keeping high adhesiveness between the semiconductor layer and the translucent electrode can be provided in accordance with the present invention.

The semiconductor element according to the present invention can be used for various light emitting apparatus such as a light source for illumination, a light source for various indicators, a light source provided in a vehicle, a light source for a display, a light source for a back light of a liquid crystal display, a light source for a sensor and a signaler.

What is claimed is:

1. A semiconductor element comprising
   a semiconductor layer,
   a translucent electrode which is formed on the semiconductor layer, and
   a pad electrode which is formed on the translucent electrode, wherein
   the translucent electrode includes a recessed part on which the pad electrode is mounted, and wherein
   a thickness of a bottom surface of the recessed part of the translucent electrode is more than 0% of and equal to or less than 70% of a thickness of a part of the translucent electrode other than the recessed part.

2. The semiconductor element according to claim 1 wherein a gap is formed between a side surface of the pad electrode and a side surface of the recessed part of the translucent electrode.

3. The semiconductor element according to claim 2 wherein the gap is filled with a translucency film which has a refractive index smaller than a refractive index of the translucent electrode.

4. The semiconductor element according to claim 3, wherein the side surface of the pad electrode is inclined inside toward an upper side of the pad electrode from a peripheral edge of a base end of the pad electrode.

5. The semiconductor element according to claim 4, wherein a part of the side surface of the recessed part is covered by the pad electrode.

6. The semiconductor element according to claim 2, wherein the side surface of the pad electrode is inclined inside toward an upper side of the pad electrode from a peripheral edge of a base end of the pad electrode.

7. The semiconductor element according to claim 6, wherein a part of the side surface of the recessed part is covered by the pad electrode.

8. The semiconductor element according to claim 1 wherein the thickness of the part of the translucent electrode other than the recessed part is equal to or more than 80 nm and equal to or less than 300 nm.

9. The semiconductor element according to claim 1 wherein a sheet resistance of the translucent electrode is equal to or less than 40Ω/□.

10. The semiconductor element according to claim 1 wherein an area of the bottom surface of the recessed part is equal to or more than 2700 μm².

11. The semiconductor element according to claim 1 wherein the pad electrode is a multiple-layer having, as a bottom layer, a layer comprised of Cr or an alloy including Cr.

* * * * *